US010764658B2

(12) United States Patent
Binggeli et al.

(10) Patent No.: US 10,764,658 B2
(45) Date of Patent: *Sep. 1, 2020

(54) SYSTEM AND APPARATUSES FOR CALIBRATING METERING CIRCUITRY

(71) Applicant: Landis+Gyr Technologies, LLC, Pequot Lakes, MN (US)

(72) Inventors: Keith Binggeli, Baxter, MN (US); Josiah Dabill, Pine River, MN (US)

(73) Assignee: Landis+Gyr Technologies, LLC, Pequot Lakes, MN (US)

(*) Notice: Subject to any disclaimer, the term of this patent is extended or adjusted under 35 U.S.C. 154(b) by 0 days.

This patent is subject to a terminal disclaimer.

(21) Appl. No.: 16/458,607

(22) Filed: Jul. 1, 2019

(65) Prior Publication Data

US 2019/0394542 A1    Dec. 26, 2019

Related U.S. Application Data

(63) Continuation of application No. 16/013,724, filed on Jun. 20, 2018, now Pat. No. 10,390,112.

(51) Int. Cl.
*H04Q 9/00*    (2006.01)
*H04L 12/10*   (2006.01)
(Continued)

(52) U.S. Cl.
CPC .............. *H04Q 9/00* (2013.01); *G01R 35/04* (2013.01); *H04B 3/54* (2013.01); *H04L 12/10* (2013.01);
(Continued)

(58) Field of Classification Search
None
See application file for complete search history.

(56) References Cited

U.S. PATENT DOCUMENTS 6,262,569 B1    7/2001   Carr et al.
8,398,435 B2    3/2013   Aurongzeb et al.
(Continued)

FOREIGN PATENT DOCUMENTS

CN    201925842    8/2011
EP    2115397      8/2017

OTHER PUBLICATIONS

Global LED & Smart Street Lighting Market (2015-2025), CISION® PR Newswire, Available online at: https://www.prnewswire.com/news-releases/global-led--smart-street-lighting-market-2015-2025-300277486.html, May 31, 2016, 4 pages.
(Continued)

*Primary Examiner* — Curtis A Kuntz
*Assistant Examiner* — Jerold B Murphy
(74) *Attorney, Agent, or Firm* — Kilpatrick Townsend & Stockton LLP

(57) ABSTRACT

Aspects of the present disclosure are directed toward a system and apparatuses for calibrating metering circuitry. An example system includes a first adapter including a plurality of receptacles proximally arranged in a circular manner on a first surface of the first adapter, the plurality of receptacles configured and arranged to be connected to endpoint controlling circuitry configured and arranged to communicate over the power lines or by using a RF communication, characteristics related to power usage of an endpoint device in a PLC network. The system further includes a second adapter including a plurality of electrical contacts disposed on a first surface of the second adapter and a plurality of terminals disposed on a second surface of the second adapter opposite of the first surface. The plurality of terminals can be physically arranged so as to plug into corresponding inputs on meter calibration circuitry. Further, the system includes a housing fixedly securing the first
(Continued)

adapter and the second adapter and enclosing circuitry configured, while in operation, to facilitate calibration of the endpoint controlling circuitry by the meter calibration circuitry.

20 Claims, 11 Drawing Sheets

(51) Int. Cl.
*G01R 35/04* (2006.01)
*H04B 3/54* (2006.01)

(52) U.S. Cl.
CPC . *H04B 2203/5433* (2013.01); *H04Q 2209/30* (2013.01); *H04Q 2209/60* (2013.01); *H04Q 2209/88* (2013.01)

(56) References Cited

U.S. PATENT DOCUMENTS

| | | | |
|---|---|---|---|
| 8,451,005 B2 | 5/2013 | Veroni | |
| 8,864,514 B2 | 10/2014 | Ilyes | |
| 9,210,780 B2* | 12/2015 | Chakravarty | H05B 47/22 |
| 9,258,872 B2 | 2/2016 | Hsu et al. | |
| 9,451,680 B2 | 9/2016 | Van Der Brug | |
| 9,461,707 B1 | 10/2016 | Virden et al. | |
| 9,860,965 B2 | 1/2018 | Recker et al. | |
| 9,924,582 B2 | 3/2018 | Vendetti et al. | |
| 9,936,550 B2 | 4/2018 | Chaoua et al. | |
| 10,003,165 B1* | 6/2018 | Johnson | F21V 23/06 |
| 10,219,360 B2 | 2/2019 | Vendetti et al. | |
| 10,390,112 B1 | 8/2019 | Binggeli et al. | |
| 2007/0001113 A1* | 1/2007 | Langlois | G01J 1/0266 |
| | | | 250/239 |
| 2009/0066258 A1 | 3/2009 | Cleland et al. | |
| 2009/0088021 A1 | 4/2009 | Kauffman et al. | |
| 2013/0181609 A1 | 7/2013 | Agrawal | |
| 2013/0210252 A1 | 8/2013 | Ilyes | |
| 2015/0115807 A1 | 4/2015 | Schroder et al. | |
| 2015/0351185 A1 | 12/2015 | Montoya Correa et al. | |
| 2017/0150565 A1* | 5/2017 | Chaoua | H05B 45/10 |
| 2019/0044294 A1* | 2/2019 | Siacotos | G12B 9/00 |

OTHER PUBLICATIONS

U.S. Appl. No. 16/013,724, Notice of Allowance dated Apr. 5, 2019, 12 pages.
Dack, Smart Street Light Metering, Radian Weco Research, Apr. 2017, 7 pages.
PCT International Patent Application No. PCT/US2019/037304, International Search Report and Written Opinion, dated Aug. 9, 2019, 13 pages.

* cited by examiner

SYSTEM AND APPARATUSES FOR CALIBRATING METERING CIRCUITRY

CROSS-REFERENCE TO RELATED APPLICATION

This is a continuation application of U.S. patent application Ser. No. 16/013,724, filed Jun. 20, 2018, now allowed, the entirety of which is incorporated herein by reference.

BACKGROUND

Power utility companies use power distribution lines to carry power to customers spanning large geographic areas, typically from one or more power generating stations (or power plants) to residential and commercial customer sites. The power is carried on power distribution lines from the power plants at relatively high voltages and using alternating current (AC). Substations are commonly located near the customer sites to provide a step-down of the high voltage to a lower voltage (e.g., using transformers). Power distribution lines carry this lower-voltage AC from the substations to multitudes of customer sites at which endpoint (e.g., power-consumption metering) devices are installed to monitor and report on the power consumed at each site.

Power distribution systems can take on various different forms, oftentimes differentiated based on how the power distribution lines and the endpoint devices are used by the utility companies. One form of a power distribution system, referred to as a power-line communication (PLC) system, has each of the multitudes of the endpoint devices configured to provide reports on the power consumed at each site by the endpoint devices transmitting this data back to the utility companies over the power lines. Another less-sophisticated type of power distribution system does not send data over the power lines (to/or from the endpoint devices), but rather relies on a meter reader to walk to each customer site and manually read each such endpoint device in order to track the power consumed.

Some of the more technically-robust PLC systems have implemented communications between customer sites through the use of mesh networks. In such mesh networks, layers of communication devices relay power outage information with communication connections being passed between adjacent communication devices, from the outermost layers towards the data collector device by way of nearby communication devices associated with the inner layers. This approach extends the communication reach of the PLC systems so as to reach customer facilities remotely located in the outermost layers of the network, and such systems can be implemented in a distributed manner so that there is no single point of failure. Moreover, when the outage event permits, this layer-to-layer communications approach can help to mitigate delays in terms of detecting outages and providing the service team with the needed confirmation.

In PLC networks, endpoint devices in the network (e.g., meters, load control switches, remote service switches, and other endpoints) can provide updated information (e.g., power consumption information and/or endpoint operating status information) by transmitting data over power lines that also carry alternating current. However, digital communication over noisy channels (e.g., over power lines and wireless mediums) poses a challenge to reliable, efficient, error-free data transfer between a transmitter and receiver.

As smart power systems (e.g., smart street lighting) emerge, electronic controllers which previously performed dusk to dawn switching of the endpoint devices are now being configured to perform additional tasks. For instance, newer generations of endpoint controllers for street lights, in addition to performing dusk to dawn switching, use photo controllers, provide WI-FI hotspots, transmit geo-location and diagnostics information, and measure energy consumption among other examples. Measurements of energy consumption by the endpoint device are particularly useful for determining how much energy each respective endpoint device has consumed, as may be useful for utility billing purposes.

Calibration of endpoint controllers ensures not only proper operation of the endpoint controllers, but that energy consumption measurements obtained by the controller are accurate. Monitoring and calibration systems may be used to determine accuracy of the endpoint controller, though these systems include the use of a plurality of test units (e.g., a Radian portable standard, a comparator, a streetlight adapter, a load, etc.) which are to be run one at a time. Accordingly, such systems are time consuming, and use a number of different pieces of equipment in order to monitor and calibrate endpoint controllers.

SUMMARY

Aspects of the present disclosure are directed to addressing the above-discussed aspects as well as others which will become apparent based on the detailed description that follows. According to one embodiment of the present disclosure, aspects are directed to a system for monitoring and calibration of endpoint devices. In certain example embodiments, aspects of the present disclosure are directed to a system for use with a central processing circuit operated on behalf of a power utility company, the central processing circuit collecting information provided over power lines from a plurality of endpoint devices receiving power over the power lines from the power utility company. The system includes a first adapter including a plurality of receptacles proximally arranged in a circular manner on a first surface of the first adapter, the plurality of receptacles configured and arranged to be connected to endpoint controlling circuitry. The endpoint controlling circuitry is configured and arranged to communicate over the power lines or by using a radio frequency (RF) communication, characteristics related to power usage of an endpoint device in a PLC network. The first adapter further includes a second surface opposite of the first surface, the second surface including a plurality of electrical contacts. The system further includes a second adapter including a plurality of electrical contacts disposed on a first surface of the second adapter and a plurality of terminals disposed on a second surface of the second adapter opposite of the first surface. The plurality of terminals are physically arranged on the second surface of the second adapter so as to plug into corresponding inputs on meter calibration circuitry. Such meter calibration circuitry is configured and arranged to monitor characteristics related to the power usage of the endpoint device. The system also includes a housing fixedly securing the first adapter and the second adapter and enclosing circuitry configured to electrically connect the electrical contacts of the first adapter with the electrical contacts of the second adapter. While in operation, the housing facilitates calibration of the endpoint controlling circuitry by the meter calibration circuitry.

In another specific example embodiment, aspects of the present disclosure involve an apparatus for use with a central processing circuit operated on behalf of a power utility company. The central processing circuit can collect information provided over power lines from a plurality of endpoint devices receiving power over the power lines from the power utility company. The apparatus includes a base surface including a plurality of terminals physically arranged on the base surface to couple to meter calibration circuitry. The meter calibration circuitry can be configured and arranged to monitor characteristics related to the power usage of an endpoint device such as a streetlight. The apparatus further includes a housing including a side surface orthogonal to the base surface and including a plurality of receptacles proximally arranged in a circular manner so as to be connected to endpoint controlling circuitry. The endpoint controlling circuitry can be configured and arranged to communicate over power lines or by using a RF communication, characteristics related to power usage of the streetlight. Also, circuitry disposed within the housing electrically connect the terminals disposed on the base surface and the plurality of receptacles to facilitate coupling of the endpoint controlling circuitry and the meter calibration circuitry for calibration of the endpoint controlling circuitry. The apparatus further includes a top surface opposite of the base surface, disposed parallel to the base surface and less than a threshold distance from the base surface to facilitate calibration of the endpoint controlling circuitry by the meter calibration circuitry.

The above summary is not intended to describe each illustrated embodiment or every implementation of the present disclosure. The figures and detailed description that follow, including that described in the appended claims, more particularly describe some of these embodiments.

BRIEF DESCRIPTION OF FIGURES

Various example embodiments may be more completely understood in consideration of the following detailed description in connection with the accompanying drawings, in which.

Figure 1:
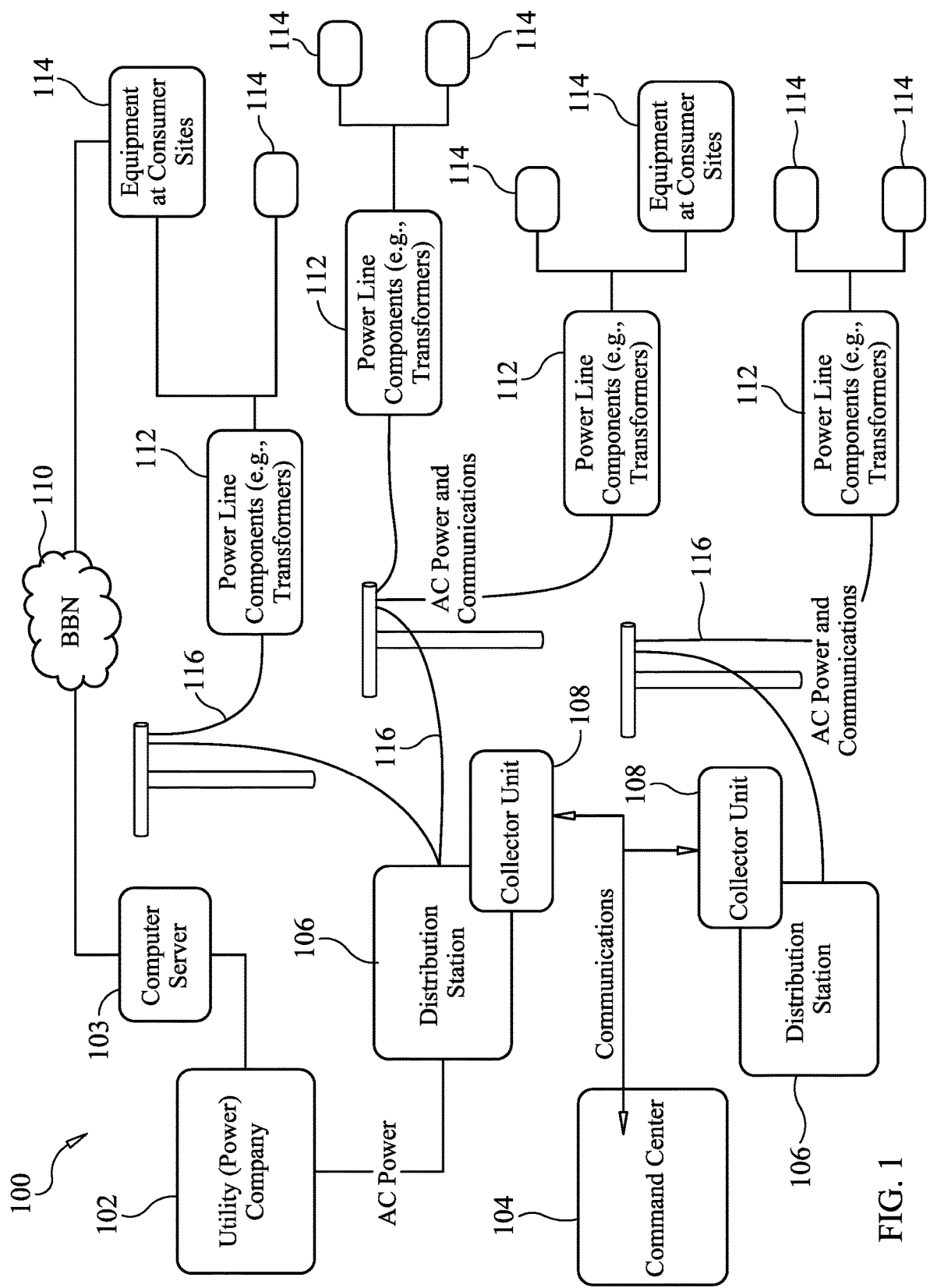
FIG. 1 is a block diagram of an example power line communication system in which endpoints (aka circuit-based endpoint devices) communicate data with collector units, consistent with embodiments of the present disclosure.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

DETAILED DESCRIPTION

Aspects of the present disclosure are believed to be applicable to a variety of different types of apparatuses, systems and methods involving monitoring and calibration of endpoint controlling circuitry. In certain implementations, aspects of the present disclosure have been shown to be beneficial when used in the context of monitoring and calibrating endpoint controlling circuitry which communicates over power lines or by using a radio frequency (RF) communication, characteristics related to power usage of a streetlight. While not necessarily so limited, various aspects may be appreciated through the following discussion of non-limiting examples which use exemplary contexts.

The public outdoor lighting market is currently undergoing a period of change where existing streetlights are being replaced with newer and more efficient light emitting diode (LED) streetlights, or solid-state lighting technology. Newer streetlights such as LEDs and solid-state lighting technology offer longer lifetimes, lower energy consumption, and reduced maintenance costs when compared with legacy streetlight technologies. Moreover, streetlights may also be coupled with a communications network to become "smart" streetlights.

Networked "smart" streetlights help cities further reduce costs through off-peak dimming and reduced maintenance expenditures. Additionally, such smart streetlights may serve as part of larger "smart city" concept, where communications networks can be used to link endpoint devices such as power and water meters, traffic lights, and parking meters.

A number of street light control systems have been developed to control and reduce energy consumption of municipal lighting systems. These street light control systems range from controlling a circuit of street lights and/or individual lights with specific ballasts and network operating protocols. These may include sending and receiving instructions via separate data networks, at high frequency over the top of a low voltage supply, or wirelessly.

Some street light controllers (e.g., endpoint controlling circuitry) may be configured with energy conservation options like twilight saving, staggering or dimming, among others. Also, some street light controllers may be configured with an astronomical clock for a particular location or a Global Positioning System (GPS) connection to give the best ON-OFF time and energy saving. Some intelligent street light controllers also come with Global System for Mobile Communications (GSM), RF or General Packet Radio Service (GPRS) communication, user adjusted according to latitude and longitude, for better street light management and maintenance. Additionally, some street light controllers also come with traffic sensors to manage the lux level of the lamp according to the traffic and to save energy by decreasing lux when there is no traffic. Newer generations of endpoint controllers for street lights, in addition to performing dusk to dawn switching, use photo controllers, provide WI-FI hotspots, transmit geo-location and diagnostics information, and measure energy consumption among other examples. Measurements of energy consumption by the endpoint device, and ensuring that the endpoint controlling circuitry accurately measures energy usage of the endpoint device, may be particularly useful for determining how much energy each respective endpoint device has consumed such as for utility billing purposes. Existing systems for testing and calibrating endpoint controlling circuitry such as street light controllers include the use of a number of testing devices including a Radian portable standard, a comparator, a streetlight adapter, a load (resistive or induced) and specialty software. Each such device is connected to the endpoint device (e.g., the street light in this example) one at a time, and the corresponding test is executed one at a time. Accordingly, such systems are time consuming, and use a number of different pieces of equipment in order to monitor and calibrate endpoint controllers.

Aspects of the present invention are directed toward a system for use with a central processing circuit operated on behalf of a power utility company, the central processing circuit collecting information provided over power lines from a plurality of endpoint devices receiving power over the power lines from the power utility company. In such embodiments, the system includes a first adapter including a plurality of receptacles proximally arranged in a circular manner on a first surface of the first adapter. The plurality of receptacles can be configured and arranged to be connected to endpoint controlling circuitry that communicate over the power lines or by using a RF communication, characteristics related to power usage of an endpoint device in a PLC network. While not so limited, the first adapter may include a second surface opposite of the first surface, the second surface including a plurality of electrical contacts. The system also includes a second adapter including a plurality of electrical contacts disposed on a first surface of the second adapter and a plurality of terminals disposed on a second surface of the second adapter opposite of the first surface. The plurality of terminals can be physically arranged on the second surface of the second adapter so as to plug into corresponding inputs on meter calibration circuitry configured and arranged to monitor characteristics related to the power usage of the measured endpoint device. The system also includes a housing fixedly securing the first adapter and the second adapter and enclosing circuitry configured to electrically connect the electrical contacts of the first adapter with the electrical contacts of the second adapter and; while in operation, to facilitate calibration of the endpoint controlling circuitry by the meter calibration circuitry.

In example embodiments the housing fixedly secures the first adapter in one direction and the second adapter in another direction at an angle that is at least orthogonal to the one direction. The second adapter can include at least four electrical contacts disposed on the first surface of the second adapter, and at least two of the four electrical contacts can be coupled by an electrically conductive bridge. Additionally and/or alternatively, the second adapter can include at least three terminals disposed on the second surface, and each respective terminal is electrically connected to a different respective electrical contact of the first adapter.

According to various example embodiments, the plurality of receptacles of the first adapter are arranged in a manner consistent with an industry standard for locking-type photocontrol devices and mating receptacles. An arrangement exemplary of such industry standard may include NEMA ANSI C136-10, titled "The American national standard for roadway and area lighting equipment—locking-type photocontrol devices and mating receptacles—physical and electrical interchangeability and testing." Additionally and/or alternatively, the plurality of receptacles of the first adapter can be arranged in a manner consistent with an industry standard for external locking-type photocontrol devices including a dimmable ballast for roadway area lighting. An arrangement exemplary of such industry standard may include NEMA ANSI C136-41, titled "American national standard for roadway and area lighting equipment—dimming control between an external locking type photocontrol and ballast or driver."

According to various example embodiments, the circuitry of the housing can facilitate calibration of the endpoint controlling circuitry by an automated and sequential meter testing process executed by the meter calibration circuitry. Accordingly, the first adapter can be disposed on a side surface of the housing and the second adapter can be disposed on a base surface of the housing orthogonal to the side surface. The base surface can be disposed less than a threshold distance from the second adapter to facilitate calibration of the endpoint controlling circuitry by the meter calibration circuitry. Examples are not so limited, however, and in some example embodiments the first adapter can be disposed on a side surface of the housing and the second adapter can be disposed on a base surface of the housing orthogonal to the side surface. In such example embodiments, the first adapter is disposed less than a threshold distance from a top surface of the adapter opposite of the base surface to facilitate calibration of the endpoint controlling circuitry via an optical port of the meter calibration circuitry. As such, the endpoint controlling circuitry can be configured and arranged to collect power usage measurements from the endpoint device over a period of time, and the circuitry of the housing can facilitate measurement of a plurality of parameters of the endpoint controlling circuitry by the meter calibration circuitry to determine the accuracy of the power usage measurements.

In specific embodiments, an apparatus can be used with a central processing circuit operated on behalf of a power utility company, the central processing circuit collecting information provided over power lines from a plurality of endpoint devices receiving power over the power lines from the power utility company. The apparatus may include a base surface including a plurality of terminals physically arranged on the base surface to couple to meter calibration circuitry configured and arranged to monitor characteristics related to the power usage of a streetlight. The apparatus may also include a housing including a side surface orthogonal to the base surface and including a plurality of receptacles proximally arranged in a circular manner so as to be connected to endpoint controlling circuitry configured and arranged to communicate over power lines or by using a RF communication, characteristics related to power usage of the streetlight. Circuitry disposed within the housing can electrically connect the terminals disposed on the base surface and the plurality of receptacles, thereby facilitating coupling of the endpoint controlling circuitry and the meter calibration circuitry for calibration of the endpoint controlling circuitry. Additionally, the apparatus can include a top surface opposite of the base surface, wherein the top surface is disposed parallel to the base surface and less than a threshold distance from the base surface to facilitate calibration of the endpoint controlling circuitry by the meter calibration circuitry.

In various embodiments, the plurality of terminals can be disposed within a five position locking-type receptacle of a first adapter. In additional and/or alternative embodiments, the plurality of terminals are disposed within a seven position locking-type receptacle of a first adapter. Moreover, in various embodiments, the circuitry is configured and arranged to facilitate calibration of the endpoint controlling circuitry in compliance with an industry standard for performance of accuracy class electricity meters.

In some example embodiments, the housing has at least a portion with a cylindrical shape, and the plurality of receptacles are disposed on a curved side wall of the housing orthogonal to the base surface. Additionally and/or alternatively, the housing may have a cylindrical shape and a recessed portion, where the side surface is disposed on a flat surface of the recessed portion. In such embodiments, the recessed portion includes a second base surface parallel to the base surface and disposed less than a threshold distance from base surface to facilitate calibration of the endpoint controlling circuitry by the meter calibration circuitry. The plurality of electrical contacts can be disposed within a locking-type receptacle of a first adapter disposed on the flat surface of the recessed portion of the housing. Moreover, the first adapter is disposed less than a threshold distance from the top surface to facilitate calibration of the endpoint controlling circuitry via an optical port of the meter calibration circuitry.

Various example embodiments described herein allow a utility company or other user the ability to use their own metering equipment (e.g., meter calibration circuitry) to test the accuracy of the endpoint controlling circuitry (e.g., street light controller). Embodiments of the present disclosure reduce the time, expense, and labor of testing the accuracy of the endpoint controlling circuitry.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Turning now to the figures, FIG. 1 is a block diagram of an example power line communication system (PLC) 100 in which endpoints (within 114) communicate data with collector units 108, consistent with PLC embodiments of the present disclosure. These communications occur over the same power lines which provide power from the utility power company to each of the customer sites. In this context and as mentioned previously, aspects of the present disclosure have been realized to benefit embodiments which employ PLC and those which do not.

With reference to FIG. 1, the PCL system 100 includes a power distribution system overlaying a broadband communications network. Illustrated aspects of the power distribution system include the utility (power) company 102 which generates the AC power for distribution via various geographically-dispersed distribution stations 106, for consumption at the facilities of customer sites where respective sets of equipment 114 are located. The equipment 114 operates based on the power received over the power lines 112. In this illustrated example, the equipment 114 at each customer site includes an endpoint device (which is or at least includes a circuit, such as a power meter and/or load switch) installed at the customer site facility. In such a PLC-type system, the endpoint devices are typically also configured with circuitry for receiving configuration and other data from the collector units 108 (e.g., located in proximity to a grouping of nearby customer sites) and for sending back reports and status information to the collector units 108, which is in turn sent back to a computer server 103 operated on behalf of the utility (power) company 102. In such PLC systems, this information is sent in both directions, between the collector units 108 and the equipment 114, over the power lines. The computer server 103 refers to and/or includes one or multiple computers (processing circuit) operating together to carry out the communications as depicted and described herein.

FIG. 1 also shows a broadband communications network ("BBN") 110 coupled between the computer server 103 and the equipment 114 at the customer sites. Also within each of the depictions of equipment 114 of FIG. 1 is a respective communication device which is enabled for communications with the computer server 103 via the broadband communications network 110. In this context, the communication device is referred to as being broadband enabled. As discussed above, each of the broadband-enabled communication devices of the equipment 114 is powered via the power lines controlled by the utility power company 102.

According to one specific implementation, the equipment 114 can include street lights, as well as endpoint controlling circuitry such as a streetlight controller. As discussed further herein, each respective endpoint device may be coupled with an apparatus which facilitates calibration of the endpoint controlling circuitry by meter calibration circuitry.

In FIG. 1, endpoints 114 transmit symbols over communications channels to collector units 108, respectively. In certain embodiments, the endpoints 114 can be located at customer locations (e.g., buildings). Transformers 112 are often located near groups of customer sites, via substations/collector housings, to provide a step-down in voltage before the AC power is provided to the customer sites. The collector circuits (shown as units 108) include circuitry configured to communicate with the endpoints of the equipment 114 over the power lines 116, and typically also include circuitry (via high-speed network interfaces, a wide-area network, and Ethernet) for communications with a command center 104 which is operated on behalf of the utility power company.

The collector units 108 can communicate to the command center 104 over a wide area network (WAN), local area network (LAN), the Internet, or other communication networks. These data networks can be implemented as a wired or wireless network. Wired networks can include any media-constrained networks including, but not limited to, networks implemented using metallic wire conductors, fiber optic materials, or waveguides. Wireless networks include all free-space propagation networks including, but not limited to, networks implemented using radio wave and free-space optical networks.

Symbols from a particular endpoint may be transmitted, at specifically allocated times/frequencies to avoid data collisions on the power lines, over any one of thousands of communications channels in the system. For example, each endpoint can be assigned a particular channel, and channel assignments for the endpoints 114 can be stored, for example, in a communications database that is accessible to the collector units 108. Consistent with embodiments of the present disclosure, each collector unit 108 can be configured to be in communication with thousands of endpoints 114 and there can be thousands of collector units 108 communicating with the command center 104. For example, a single collector can be configured to communicate with over 100,000 endpoint devices (e.g., power meters and load switches) at customer sites and a command center can be configured to communicate with over 1,000 collectors. Thus, there can be millions of total endpoints and many thousands of these endpoints can be considered region-specific or neighbor endpoints (many or all co-located with broadband-enable devices) for communications to the same collector over a shared power distribution line. In instances where some of these facilities have generators and/or battery backup circuits which operate to supply backup power in the event of a power outage, feedback from other than the broadband-enabled device can be used to supplement other indications or evidence (e.g., mesh, PLC neighbor as described herein) that an outage may have occurred for each such facility or region/neighborhood.

Figure 2:
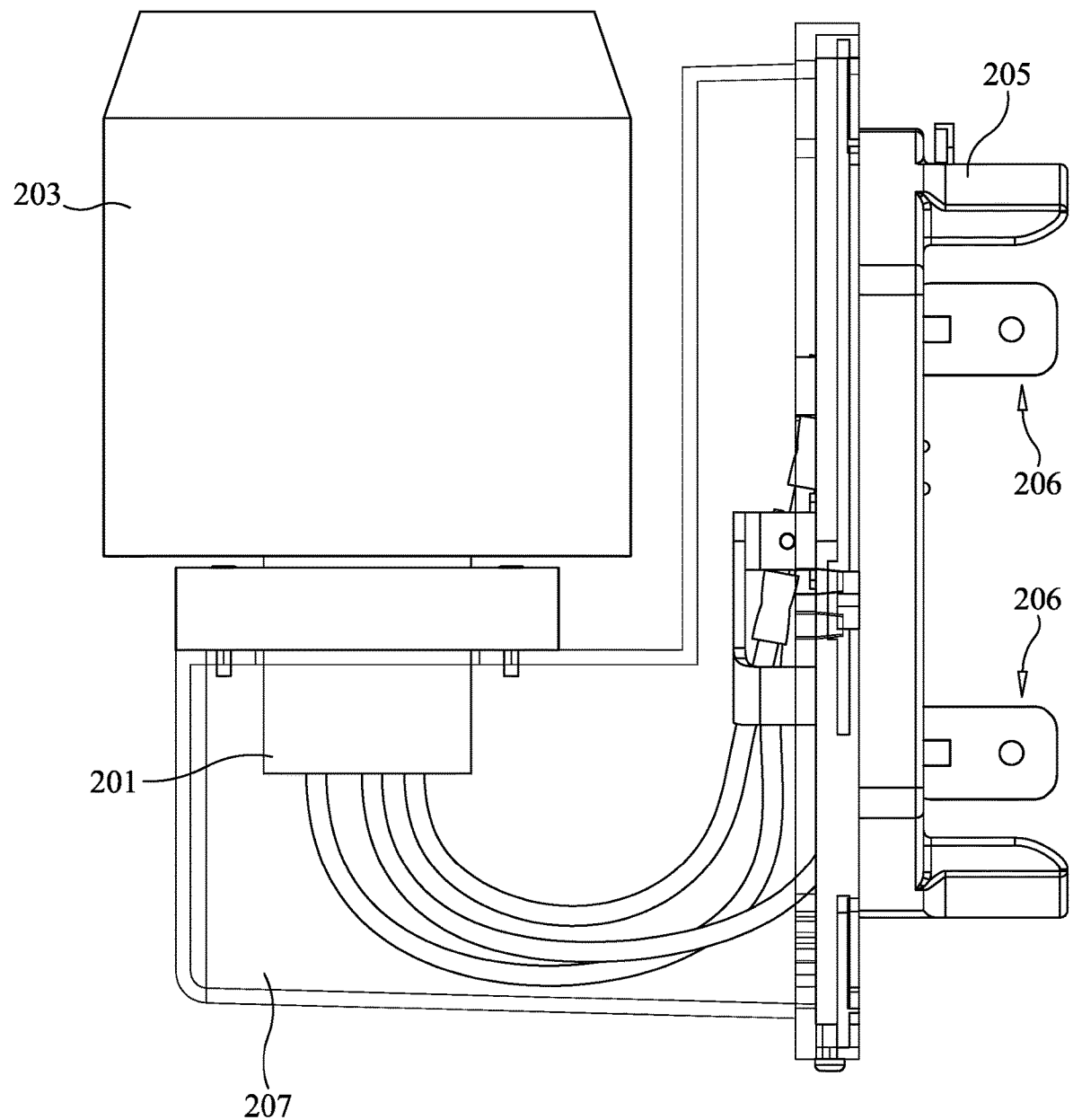
FIG. 2 illustrates an example system, in accordance with the present disclosure.

FIG. 2 illustrates an example system in accordance with the present disclosure. The system illustrated in FIG. 2 may be used with a central processing circuit operated on behalf of a power utility company. The central processing circuit can collect information provided over power lines from a plurality of endpoint devices receiving power over the power lines from the power utility company, as illustrated and described with regards to FIG. 1. As illustrated in FIG. 2, the system may include a first adapter 201 including a plurality of receptacles proximally arranged in a circular manner on a first surface of the first adapter. The plurality of receptacles can be configured and arranged to be connected to endpoint controlling circuitry 203, which in some instances may be a streetlight controller. The endpoint controlling circuitry 203 can be configured and arranged to communicate over the power lines or by using a RF communication, characteristics related to power usage of an endpoint device (e.g., a street lamp) in a PLC network. The plurality of receptacles of the first adapter 201 can be arranged in a manner consistent with an industry standard for locking-type photocontrol devices and mating receptacles. Such industry standard may be exemplified by NEMA ANSI C136-10. Additionally and/or alternatively, the plurality of receptacles of the first adapter 201 can be arranged in a manner consistent with an industry standard for external locking-type photocontrol devices including a dimmable ballast for roadway area lighting. Such industry standard may be exemplified by NEMA ANSI C136-41.

The system can also include a second adapter 205 including a plurality of electrical contacts disposed on a first surface of the second adapter 205 and a plurality of terminals 206 disposed on a second surface of the second adapter 205 opposite of the first surface. The plurality of terminals 206 are physically arranged on the second surface of the second adapter 205 so as to plug into corresponding inputs on meter calibration circuitry (the meter calibration circuitry not illustrated in FIG. 2). The meter calibration circuitry can be configured and arranged to monitor characteristics related to the power usage of the endpoint device. The meter calibration circuitry may include industry standard testing equipment, configured and arranged to test meter equipment, such as may be exemplified by a WECO meter test station produced by Radian Research, Inc.

Although not illustrated in FIG. 2, the first adapter can include a second surface opposite of the first surface, the second surface including a plurality of electrical contacts. A housing 207 can fixedly secure the first adapter 201 and the second adapter 205 and enclose circuitry configured to electrically connect the electrical contacts of the first adapter 201 with the electrical contacts of the second adapter 205 and, while in operation, facilitate calibration of the endpoint controlling circuitry by meter calibration circuitry. The circuitry of the housing 207 can facilitate calibration of the endpoint controlling circuitry 203 by an automated and sequential meter testing process executed by the meter calibration circuitry. For instance, the endpoint controlling circuitry 203 can be configured and arranged to collect power usage measurements from an endpoint device over a period of time, and the circuitry of the housing 207 can facilitate measurement of a plurality of parameters of the endpoint controlling circuitry 203 by the meter calibration circuitry to determine the accuracy of the power usage measurements.

As illustrated in FIG. 2, the housing 207 can fixedly secure the first adapter 201 in one direction and the second adapter 205 in another direction at an angle that is at least orthogonal to the one direction. For instance, as illustrated in FIG. 2, the first adapter 201 is disposed at a right angle to the second adapter 205. In additional and/or alternative embodiments, the first adapter 201 can be disposed on a side surface of the housing 207 and the second adapter 205 can be disposed on a base surface of the housing 207 orthogonal to the side surface, where the base surface is disposed less than a threshold distance from the second adapter 205 to facilitate calibration of the endpoint controlling circuitry. In yet further embodiments, the first adapter 201 can be disposed on a side surface of the housing 207 and the second adapter 205 can be disposed on a base surface of the housing 207 orthogonal to the side surface. In such embodiments, the first adapter 201 is disposed less than a threshold distance from a top surface opposite of the base surface to facilitate calibration of the endpoint controlling circuitry 203 via an optical port of the meter calibration circuitry.

Figure 3:
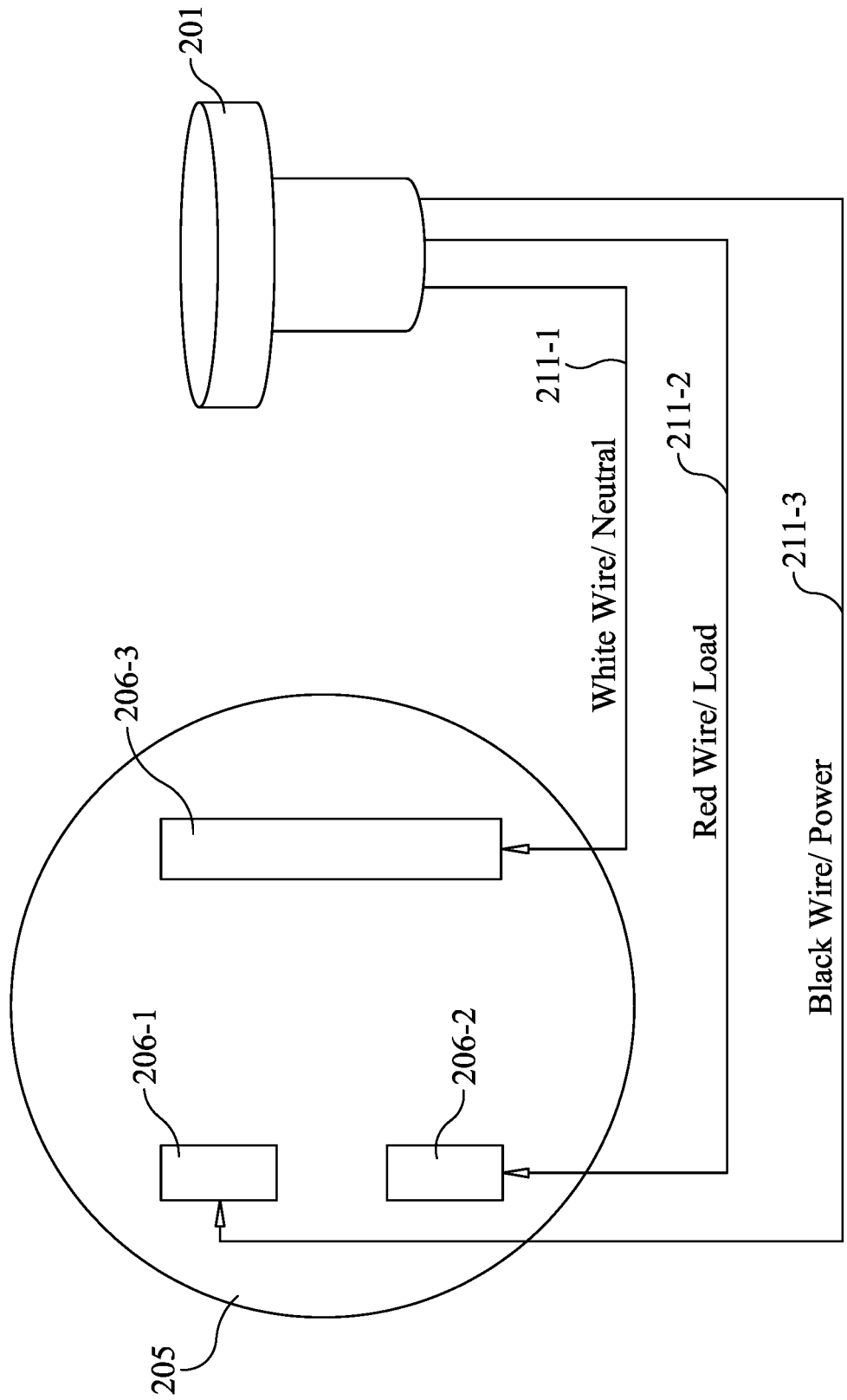
FIG. 3 further illustrates various components of an example system, in accordance with the present disclosure.

FIG. 3 further illustrates various components of an example system in accordance with the present disclosure. As illustrated in FIG. 3, the second adapter 205 may include at least three terminals 206-1, 206-2, 206-3 (collectively referred to herein as terminals 206) disposed on the second (e.g., bottom surface) of the second adapter 205, where each respective terminals 206 is electrically connected to a different respective electrical contact of the first adapter 201 via wires 211-1, 211-2; and 211-3.

Figure 4:
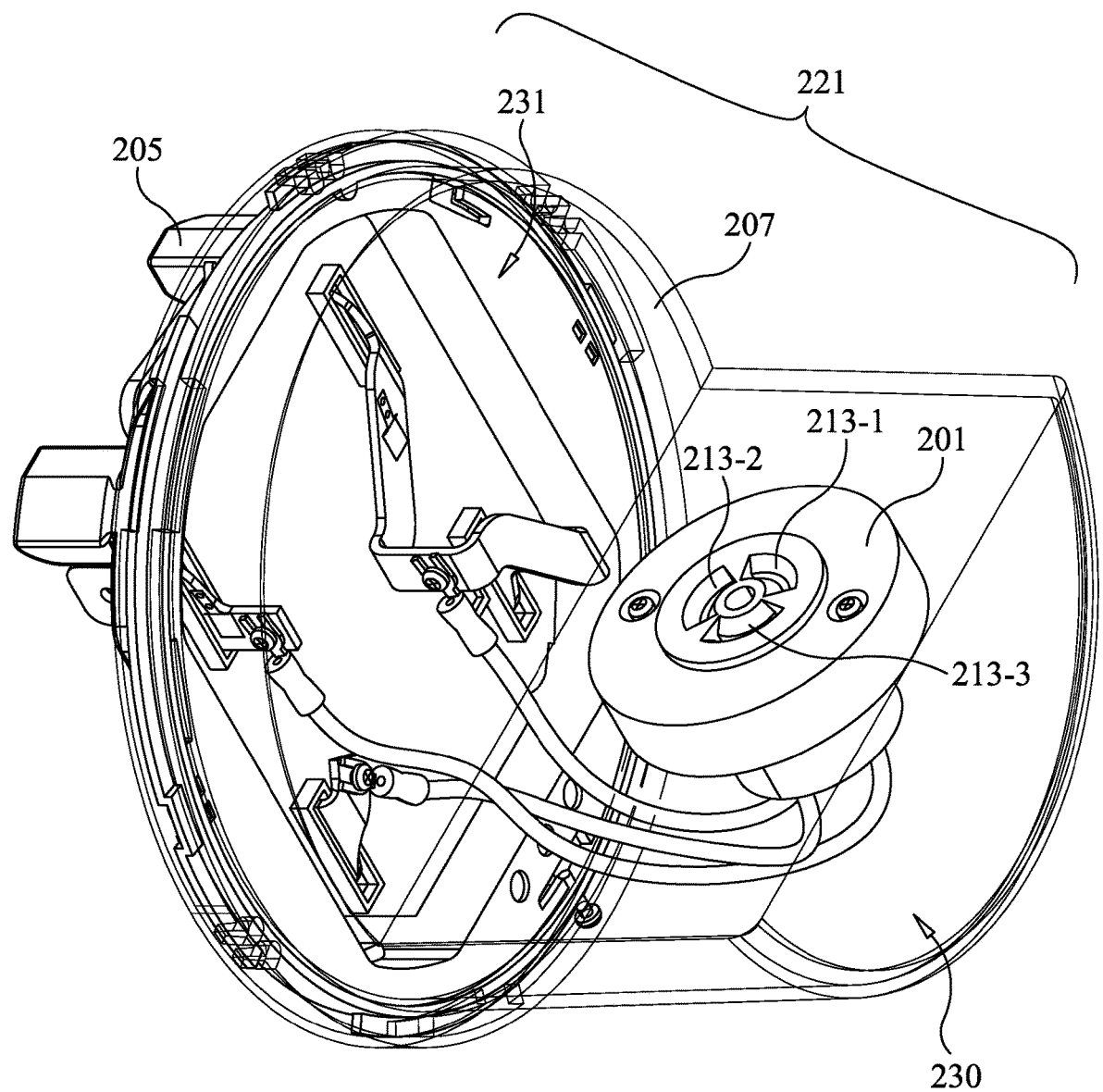
FIG. 4 illustrates an example apparatus for use with a central processing circuit operated on behalf of a power utility company, in accordance with the present disclosure.

FIG. 4 illustrates an example apparatus for use with a central processing circuit operated on behalf of a power utility company, in accordance with the present disclosure. As illustrated and discussed with regards to FIG. 1, the central processing circuit can collect information provided over power lines from a plurality of endpoint devices receiving power over the power lines from the power utility company. In various embodiments, the apparatus includes a second adapter 205 including a plurality of terminals physically arranged to couple to meter calibration circuitry configured and arranged to monitor characteristics related to the power usage of a streetlight. Further, the apparatus includes a housing 207 including a side surface orthogonal to the second adapter 205 and including a plurality of receptacles 213-1, 213-2, and 213-3 (hereinafter referred to collectively as the plurality of receptacles 213), proximally arranged in a circular manner so as to be connected to endpoint controlling circuitry. As described herein, the endpoint controlling circuitry can be configured and arranged to communicate over power lines or by using a RF communication, characteristics related to power usage of the streetlight. The apparatus can further include circuitry disposed within the housing 207 and electrically connecting the terminals disposed on the second adapter 205 and the plurality of receptacles 213 to facilitate coupling of the endpoint controlling circuitry and the meter calibration circuitry for calibration of the endpoint controlling circuitry. In various embodiments, the apparatus includes a second base surface 231 opposite of the second adapter 205, where the top surface is disposed parallel to the second adapter 205 and less than a threshold distance from the second adapter 205 to facilitate calibration of the endpoint controlling circuitry by the meter calibration circuitry.

FIG. 4 illustrates the plurality of receptacles 213 disposed within a three position locking-type receptacle of a first adapter 201. However, additional and/or alternative configurations of the plurality of receptacles 213 may be used. For instance, the plurality of receptacles 213 can be disposed within a five position locking-type receptacle of a first adapter 201, and/or within a seven five position locking-type receptacle of a first adapter 201.

Figure 5:
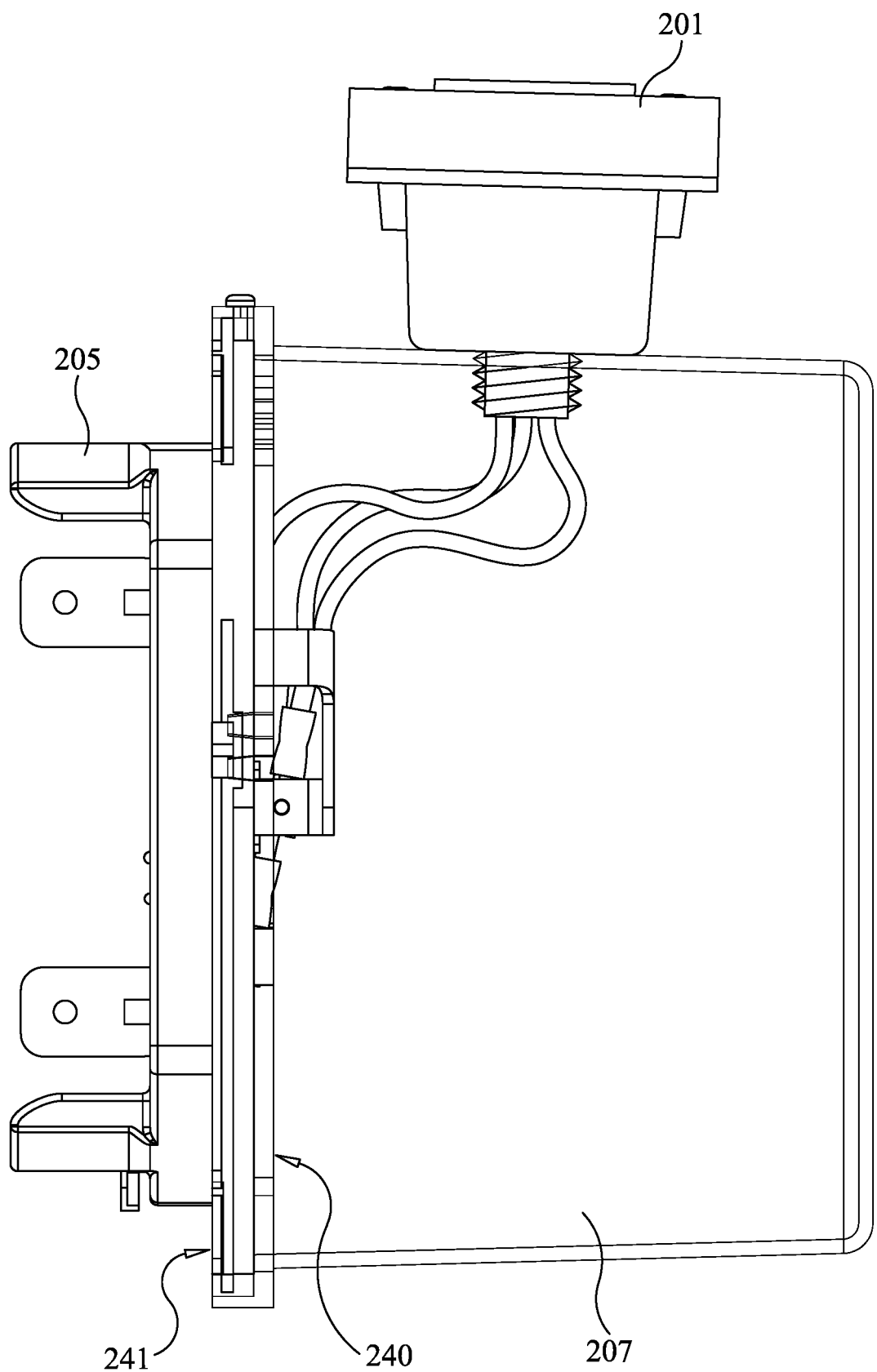
FIG. 5 further illustrates an example apparatus for use with a central processing circuit operated on behalf of a power utility company, in accordance with the present disclosure.
Figure 6:
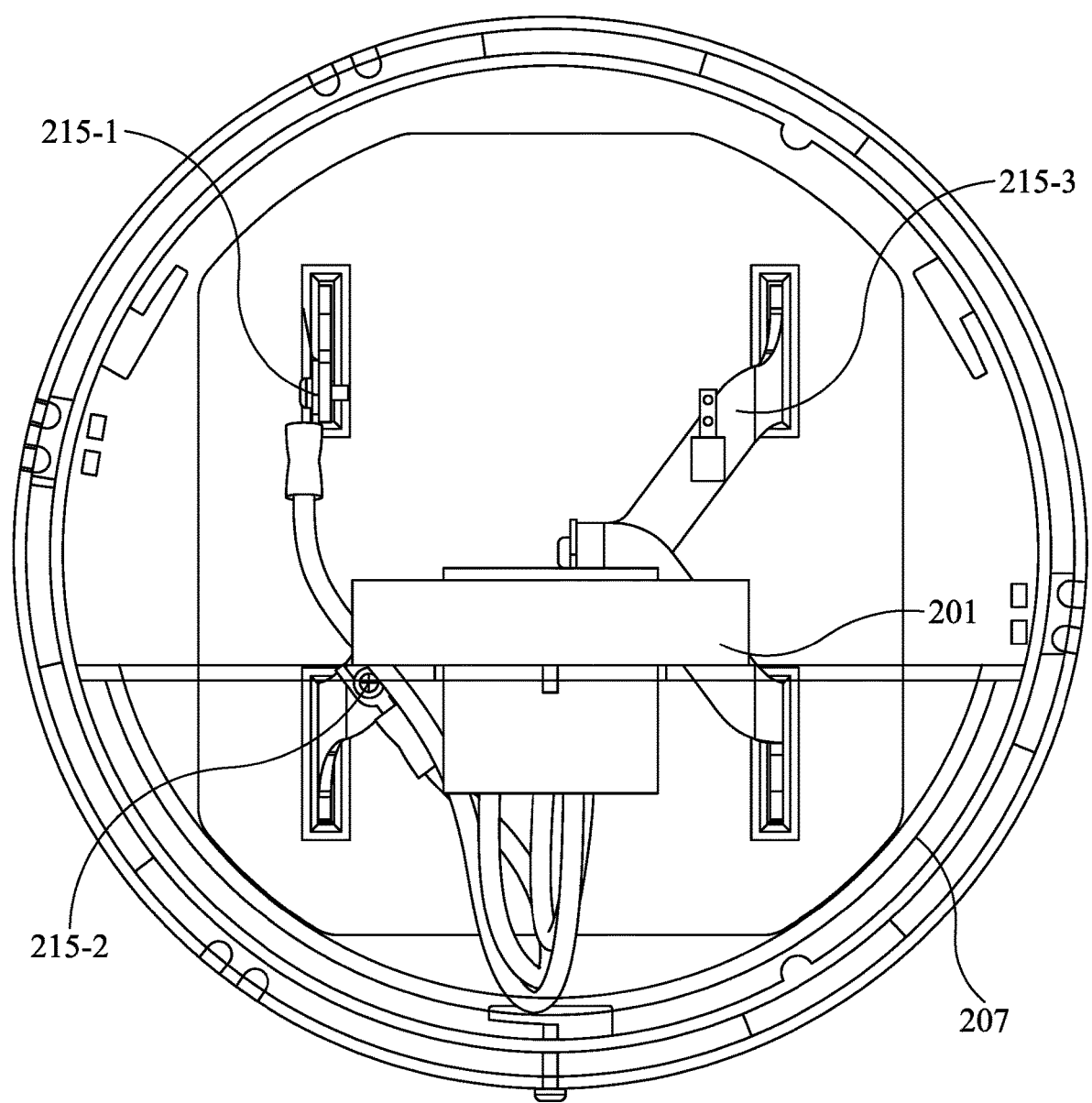
FIG. 6 further illustrates an example apparatus for use with a central processing circuit operated on behalf of a power utility company, in accordance with the present disclosure.

FIGS. 5 and 6 further illustrate an example apparatus for use with a central processing circuit operated on behalf of a power utility company, in accordance with the present disclosure. As illustrated in FIG. 5, the housing 207 can have at least a portion with a cylindrical shape, and the plurality of receptacles (within the first adapter 201) can be disposed on a curved side wall of the housing orthogonal to the second adapter 205. Additionally and/or alternatively, the housing 207 may have a cylindrical shape 220 and a recessed portion 221, as illustrated in FIG. 4. In such example embodiments, the side surface is disposed on a flat surface of the recessed portion 221, and the recessed portion 221 includes a second base surface 231 parallel to a plane on which the second adapter is disposed. The second base surface 231 can be disposed less than a threshold distance from second adapter 205 to facilitate calibration of the endpoint controlling circuitry by the meter calibration circuitry. Also illustrated in FIG. 6, electrical contacts 215-1, 215-2, and 215-3 may be included in the second adapter. As illustrated, some of the electrical contacts may be coupled by an electrically conductive bridge.

Figure 7:
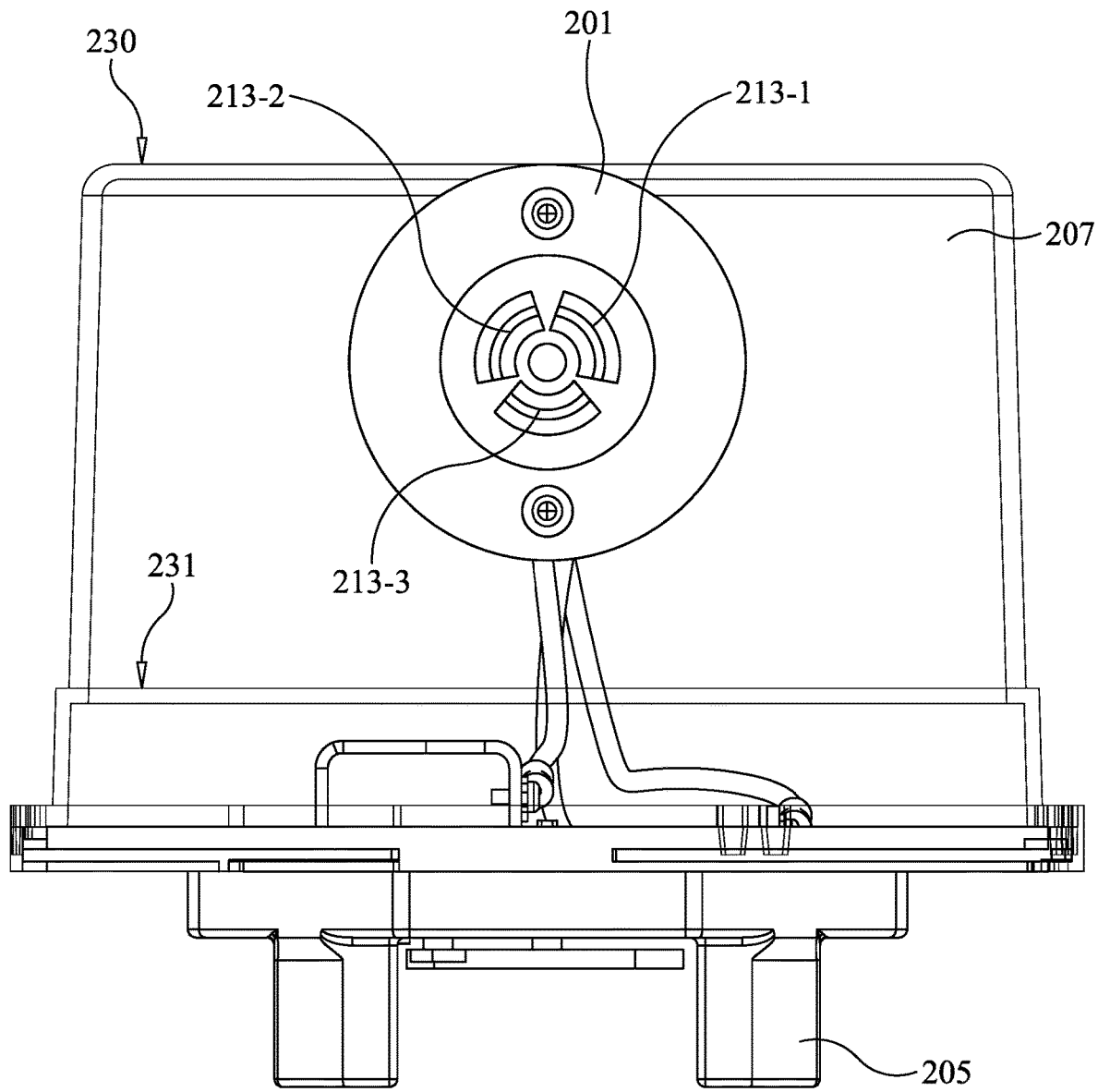
FIG. 7 further illustrates a perspective view of an example apparatus for use with a central processing circuit operated on behalf of a power utility company, in accordance with the present disclosure.

FIG. 7 further illustrates a perspective view of an example apparatus for use with a central processing circuit operated on behalf of a power utility company, in accordance with the present disclosure. As illustrated in FIG. 7, the apparatus can include a top surface 230 opposite of the second adapter 205, where the top surface 230 is disposed parallel to the second adapter 205 and less than a threshold distance from the second adapter 205 to facilitate calibration of the endpoint controlling circuitry by the meter calibration circuitry. The apparatus can include a recessed portion (e.g., 221 illustrated in FIG. 4) which further includes a second base surface 231 parallel to the second adapter 205 and disposed less than a threshold distance from second adapter 205 to facilitate calibration of the endpoint controlling circuitry by the meter calibration circuitry.

Figure 8:
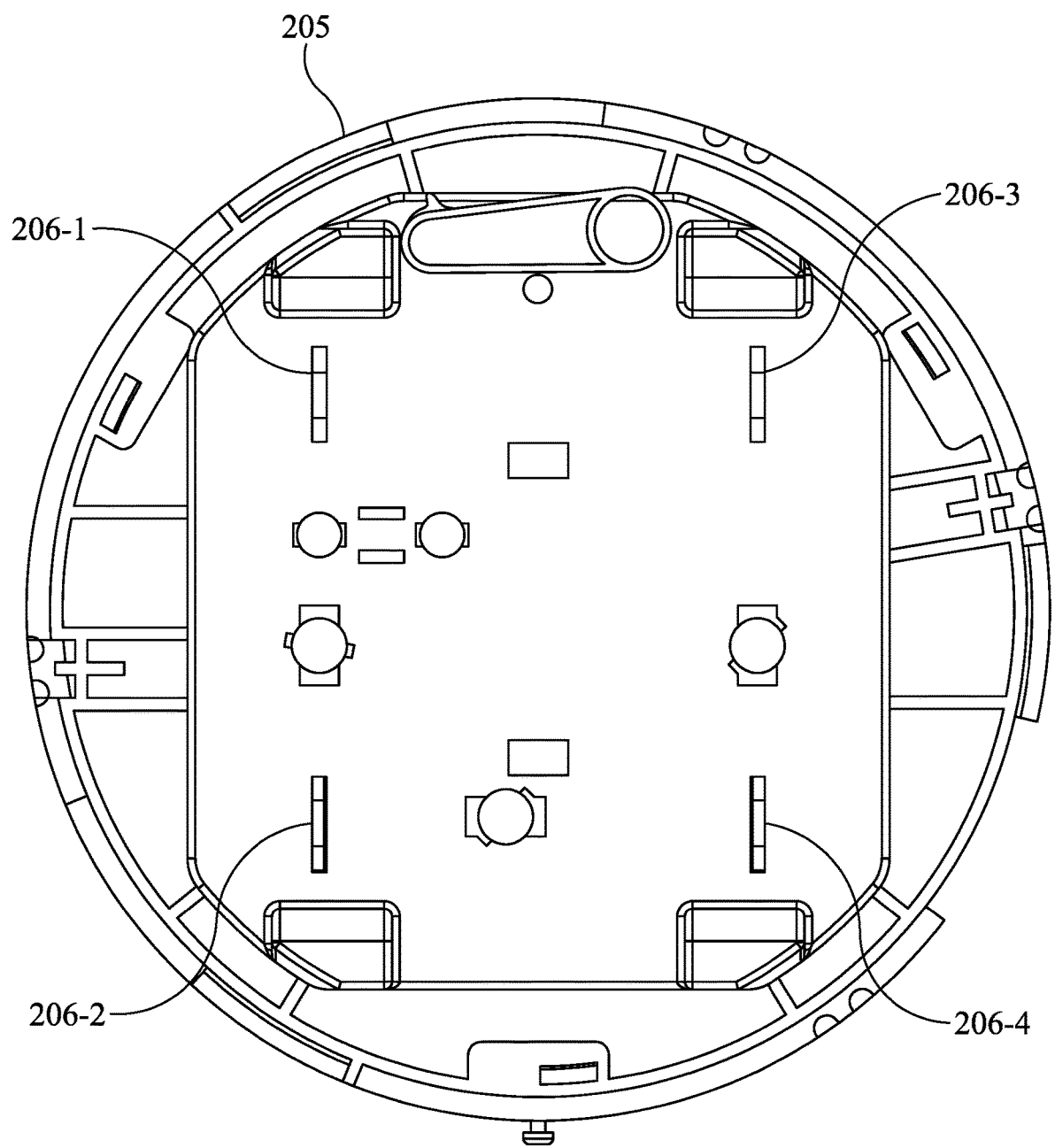
FIG. 8 illustrates an example view of the second adapter of an example apparatus for use with a central processing circuit operated on behalf of a power utility company, in accordance with the present disclosure.

FIG. 8 illustrates an example apparatus for use with a central processing circuit operated on behalf of a power utility company, in accordance with the present disclosure. Particularly, FIG. 8 illustrates a view of the second adapter of the apparatus (e.g., 205 illustrated in FIG. 5), such that the terminals 206 are projecting toward the viewer. As illustrated in FIG. 8, the second adapter (e.g., the second adapter 205 of the apparatus) can include at least four terminals 206-1, 206-2, 206-3, 206-4 (referred to collectively as terminals 206). Referring back to FIG. 5, the terminals 206 can be disposed on a second surface 241 of the second adapter 205, whereas the electrical contacts which are electrically coupled to the first adapter (e.g., 201 illustrated in FIG. 5) can be disposed on a first surface 240 of the second adapter 205, which is opposite of the first surface. For instance, referring back to FIG. 6, the apparatus can include at least four electrical contacts 215-1, 215-2, 215-3, and 215-4 disposed on the first surface. As illustrated in FIG. 6, at least a portion of the four electrical contacts on the first surface can be coupled by an electrically conductive bridge. As used herein, an electrically conductive bridge refers to or includes a piece of electrically conductive material which electrically couples at least two of the electrical contacts 215. Although FIG. 8 illustrates the second adapter as having four terminals configured in a square pattern, and each terminal having a same general shape, example embodiments are not so limited. For instance, referring to FIG. 3, the terminals can have different shapes and/or sizes, fewer than four terminals may be used (e.g., three illustrated in FIG. 3).

Figure 9:
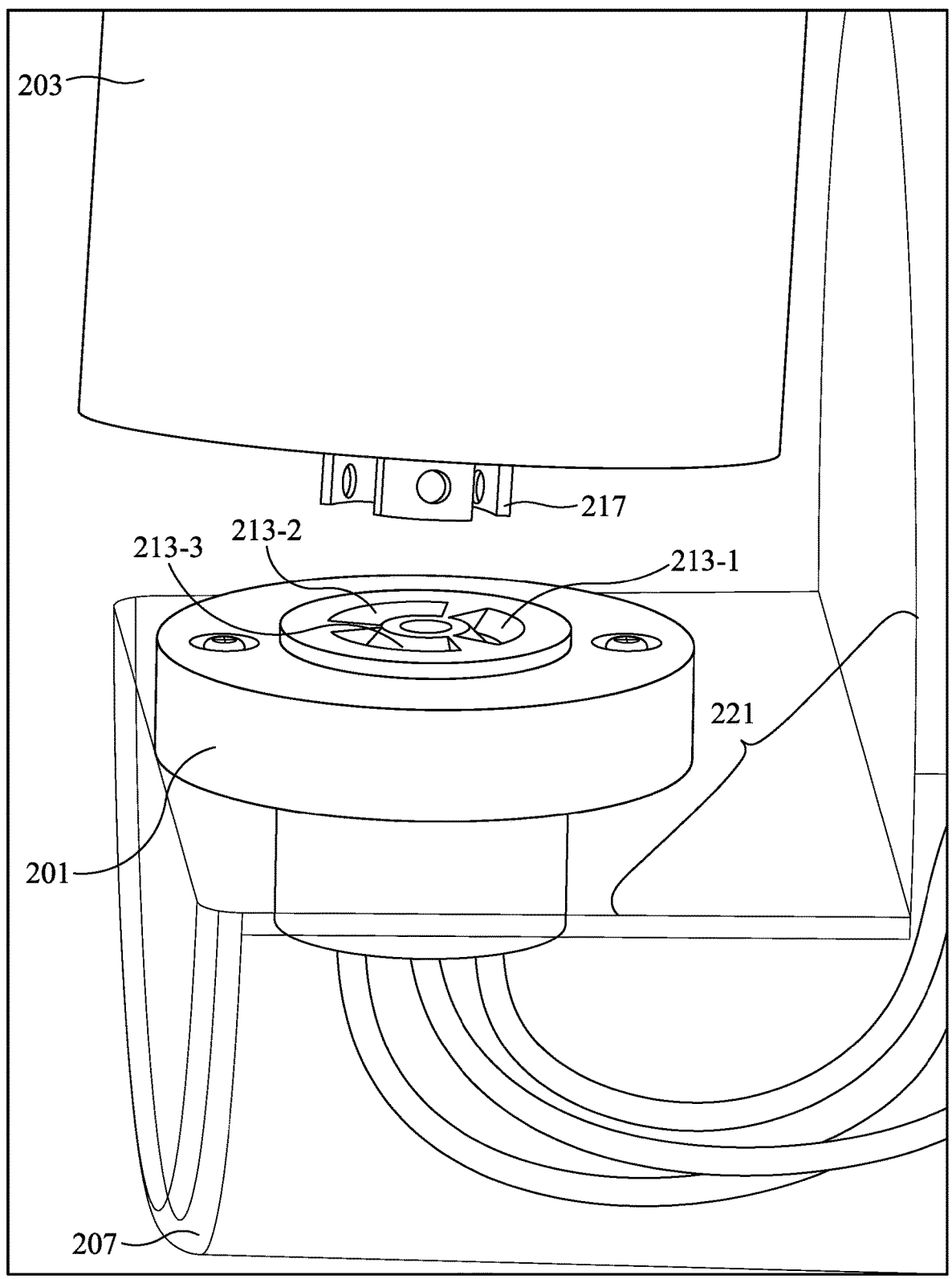
FIG. 9 illustrates a perspective view of a system for use with a central processing circuit operated on behalf of a power utility company, in accordance with the present disclosure.

FIG. 9 illustrates a perspective view of a system for use with a central processing circuit operated on behalf of a power utility company, in accordance with the present disclosure. As illustrated in FIG. 9, the apparatus may include a first adapter 201 including a plurality of receptacles 213 proximally arranged in a circular manner on a first surface of the first adapter 201. The plurality of receptacles 213 can be configured and arranged to receive terminals 217 of endpoint controlling circuitry configured and arranged to communicate over the power lines or by using a RF communication, characteristics related to power usage of an endpoint device an a PLC network. As discussed herein, the plurality of receptacles 213 and the terminals 217 can have different configurations other than a circular arrangement with three receptacles and terminals, as illustrated in FIG. 9.

Figure 10:
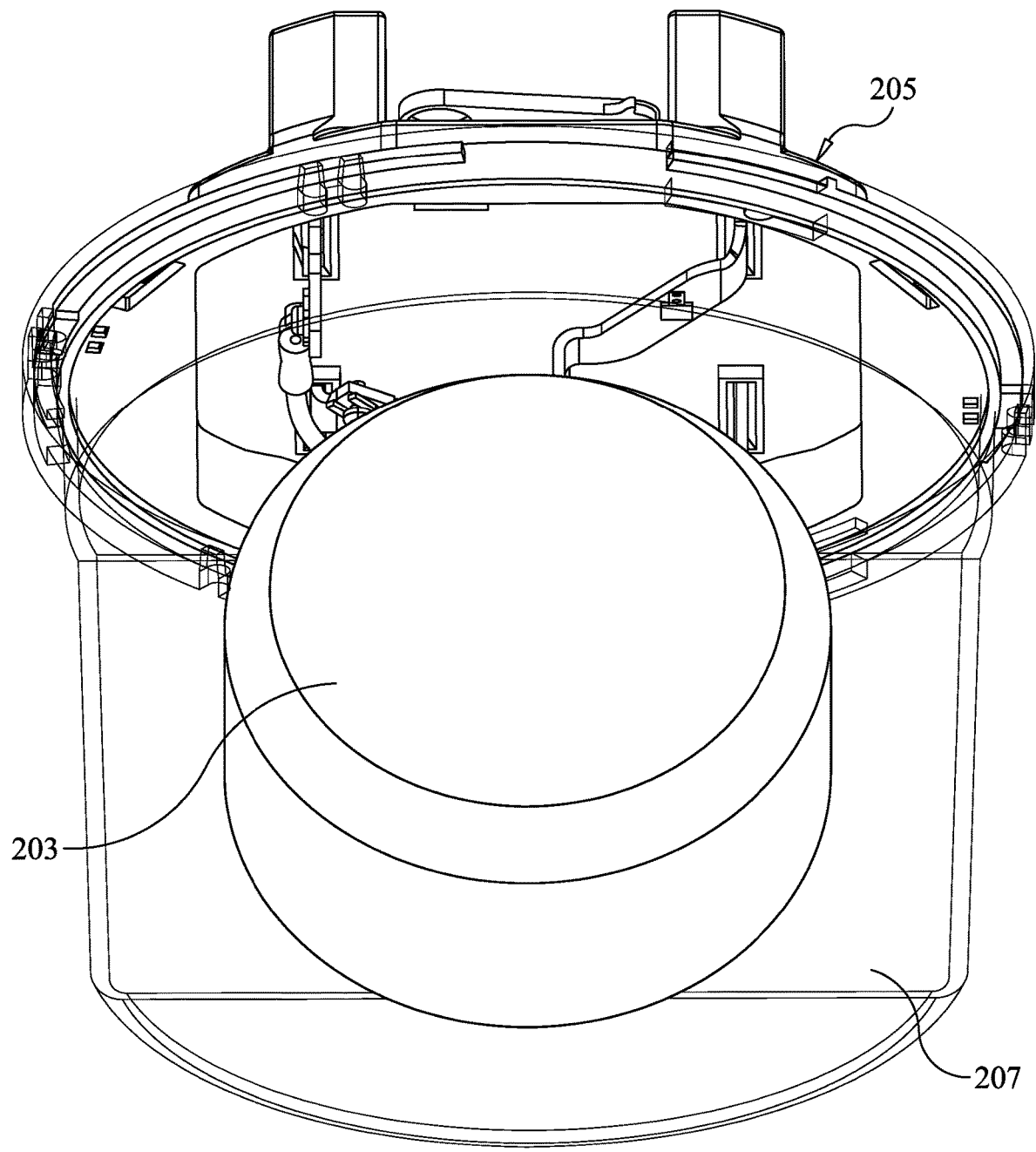
FIG. 10 further illustrates a perspective view of a system for use with a central processing circuit operated on behalf of a power utility company, in accordance with the present disclosure.

FIG. 10 further illustrates a perspective view of a system for use with a central processing circuit operated on behalf of a power utility company, in accordance with the present disclosure. As illustrated in FIG. 10, endpoint controlling circuitry 203 can be coupled to an adapter disposed on a housing 207 of the apparatus. A second adapter 205, disposed on a base surface 205 of the apparatus can include a plurality of terminals so as to plug into corresponding inputs on meter calibration circuitry. That is, the housing 207 can fixedly securing a first adapter and a second adapter and enclose circuitry configured to electrically connect the electrical contacts of the first adapter with the electrical contacts of the second adapter and, while in operation, to facilitate calibration of the endpoint controlling circuitry by the meter calibration circuitry.

Figure 11A:
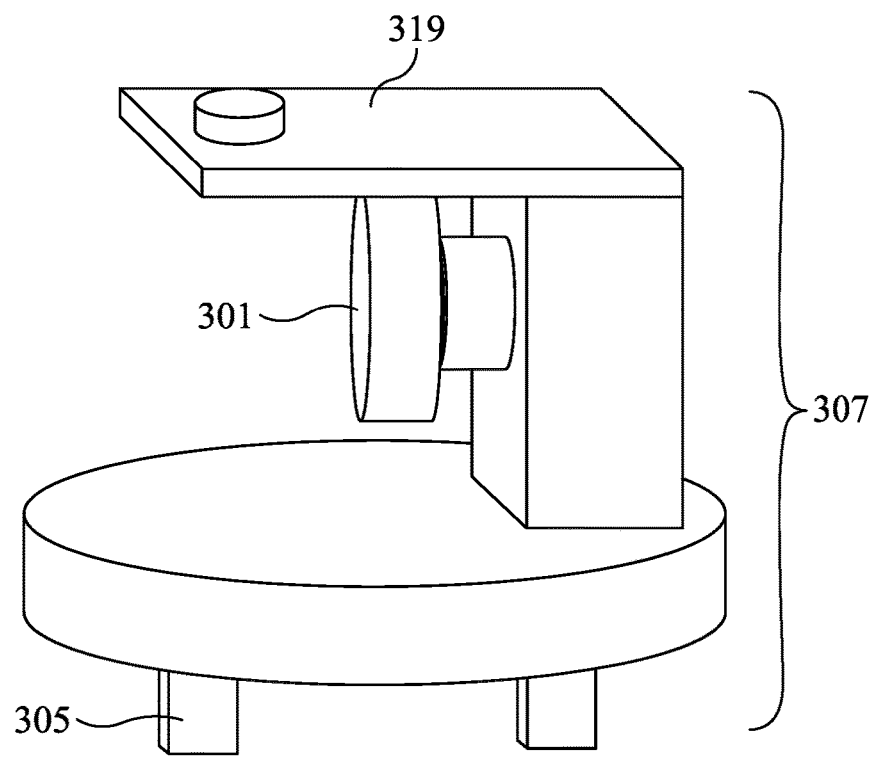
FIG. 11A further illustrates a perspective view of a system for use with a central processing circuit operated on behalf of a power utility company, in accordance with the present disclosure.
Figure 11B:
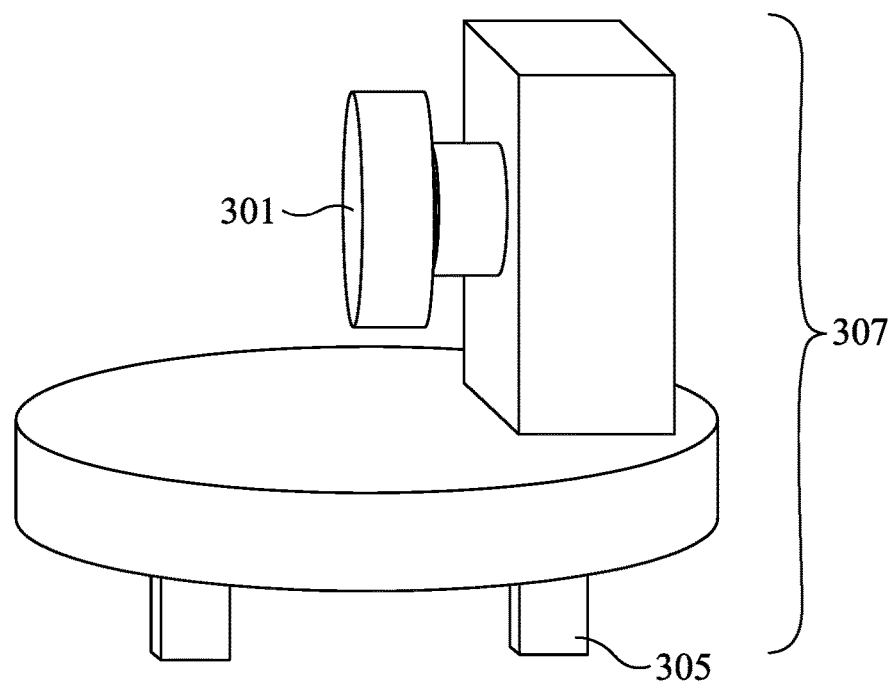
FIG. 11B further illustrates a perspective view of a system for use with a central processing circuit operated on behalf of a power utility company, in accordance with the present disclosure.

FIGS. 11A and 11B further illustrate perspective views of a system for use with a central processing circuit operated on behalf of a power utility company, in accordance with the present disclosure. Particularly, FIG. 11A illustrates a simple block diagram of the apparatus illustrated herein, for example in FIG. 4. As illustrated in FIG. 11A, the apparatus includes a first adapter 301 and a second adapter 305, as discussed herein. In additional example embodiments, the first adapter 301 can be positioned on the housing 307 such that a magnetic pickup 319 of an optical port of the meter calibration circuitry can be used. Additionally and/or alternatively, as illustrated in FIG. 11B, the first adapter 301 can be positioned on the housing 307 less than a threshold distance from the second adapter 305 to facilitate calibration of the endpoint controlling circuitry by the meter calibration circuitry.

Unless otherwise indicated, various general purpose systems and/or logic circuitry may be used with programs in accordance with the teachings herein, or it may prove convenient to construct a more specialized apparatus to perform the required method. For example, according to the present disclosure, one or more of the methods can be implemented in hard-wired circuitry by programming a general-purpose processor, other fully or semi-programmable logic circuitry, and/or by a combination of such hardware and a general-purpose processor configured with software and/or data. As another example, it will be appreciated that the term "endpoint device" refers to and/or includes circuits enabled to measure and/or communicate power consumption information for example over the illustrated broadband network, such as a power meter, load switch, remote service switches, among other examples. Accordingly, the various components and processes shown in the figures can be implemented in a variety of circuit-based forms, such as through the use of data processing circuits (operative by circuit components alone or in combination with configuration/software data, otherwise known as "logic circuit(ry)" and/or "modules").

It is recognized that aspects of the disclosure can be practiced with computer/processor-based system configurations other than those expressly described herein. The required structure for a variety of these systems and circuits would be apparent from the intended application and the above description.

The various embodiments described above are provided by way of illustration and should not be construed to necessarily limit the disclosure. Based on the above discussion and illustrations, those skilled in the art will readily recognize that various modifications and changes may be made to the present disclosure without strictly following the exemplary embodiments and applications illustrated and described herein. For instance, such changes may include variations on particular circuits and/or software code to implement one or more of the various modules. Such modifications and changes do not depart from the true spirit and scope of the present disclosure, including aspects set forth in the following claims.

What is claimed is:

1. An apparatus used for calibrating an endpoint controlling circuitry by a meter calibration circuitry, wherein the endpoint controlling circuitry is configured to monitor power usage by a corresponding endpoint device, the apparatus comprising:
   a first adapter including a plurality of connectors on an inner surface of the first adapter and a plurality of receptacles on an outer surface of the first adapter, the plurality of receptacles configured to receive a plurality of terminals of the endpoint controlling circuitry;
   a second adapter including a plurality of connectors on an inner surface of the second adapter and a plurality of terminals on an outer surface of the second adapter projecting away from the outer surface of the second adapter, the plurality of terminals configured to connect to the meter calibration circuitry; and
   a housing fixedly securing the first adapter and the second adapter, wherein the first adapter is mounted to a first outer surface of the housing and the second adapter is mounted to a second outer surface of the housing and the first outer surface and the second outer surface are approximately perpendicular,
   wherein the plurality of connectors of the first adapter and the plurality of connectors of the second adapter are electrically connected to each other within the housing and each one of the connectors of the first adapter is electrically connected to a different one of the plurality of connectors of the second adapter.

2. The apparatus of claim 1, wherein the plurality of connectors of the first adapter includes a first connector, a second connector, and a third connector, and the plurality of connectors of the second adapter includes four connectors, and wherein the first connector is electrically connected to a first one of the plurality of connectors of the second adapter, the second connector is electrically connected to a second one of the plurality of connectors of the second adapter, and the third connector is electrically connected to a third one of the plurality of connectors of the second adapter and a fourth one of the plurality of connectors of the second adapter.

3. The apparatus of claim 2, wherein the housing has a cylindrical shape with a recessed portion and a non-recessed portion, and wherein the first connector, the second connector, and the third connector connect to the first adapter within the non-recessed portion of the housing.

4. The apparatus of claim 1, wherein the housing has a cylindrical shape with a recessed portion, the recessed portion defined by the first outer surface of the housing and a third outer surface of the housing, wherein the first surface of the second adapter is approximately parallel to the third outer surface of the housing.

5. The apparatus of claim 1, wherein the housing has a cylindrical shape and the second adapter is located at a base of the housing.

6. The apparatus of claim 1, wherein the plurality of receptacles are proximally arranged in a circular manner on the outer surface of the first adapter.

7. The apparatus of claim 1, wherein the plurality of receptacles of the first adapter are arranged in a manner consistent with an industry standard for a locking-type photocontrol device and mating receptacle or an external locking-type photocontrol device including a dimmable ballast for roadway area lighting.

8. The apparatus of claim 1, wherein the plurality of terminals of the second adapter include four blades that are arranged in a square pattern.

9. An apparatus used for calibrating an endpoint control device by a meter calibration device, wherein the endpoint control device is configured to monitor power usage by a corresponding endpoint device, the apparatus comprising:
   a first adapter including a plurality of receptacles on an outer surface of the first adapter, the plurality of receptacles configured to connect to the endpoint control device;
   a second adapter including a plurality of terminals disposed on an outer surface of the second adapter and a plurality of connectors disposed on an inner surface of the second adapter, the plurality of terminals disposed on the outer surface of the second adapter project away from the outer surface of the second adapter and are configured to connect to the meter calibration device and are electrically connected to the plurality of connectors disposed on the inner surface of the second adapter;

a housing; and a plurality of electrical connectors within the housing, wherein each of the electrical connectors connects one of a plurality of connectors located on an inner surface of the first adapter with at least one of the plurality of connectors of the second adapter disposed on the inner surface of the second adapter, wherein the first adapter is mounted to a first outer surface of the housing and the second adapter is mounted to an outer surface of a base portion of the housing, and the first outer surface and the outer surface of the base portion are approximately perpendicular.

10. The apparatus of claim 9, wherein the plurality of connectors located on the inner surface of the first adapter includes three connectors, and the plurality of connectors disposed on the inner surface of the second adapter includes four connectors, and the plurality of electrical connectors includes three electrical connecters, and wherein a first electrical connector connects a first one of the plurality of connectors of the first adapter to a first one of the plurality of connectors disposed on the inner surface of the second adapter, a second electrical connector connects a second one of the plurality of connectors of the first adapter to a second one of the plurality of connectors disposed on the inner surface of the second adapter, and a third electrical connector connects a third one of the plurality of connectors of the first adapter to third and fourth ones of the plurality of connectors disposed on the inner surface of the second adapter.

11. The apparatus of claim 9, wherein the housing has a cylindrical shape with a recessed portion and a non-recessed portion, and wherein the plurality of electrical connectors connect to the first adapter within the non-recessed portion of the housing.

12. The apparatus of claim 9, wherein the housing has a cylindrical shape with a recessed portion, the recessed portion defined by the first outer surface of the housing and a second surface of the housing, wherein the outer surface of the second adapter is approximately parallel to the second surface of the housing, and wherein the first adapter is mounted to the first outer surface of the housing.

13. The apparatus of claim 9, wherein the housing has a cylindrical shape and the second adapter is located at a base of the housing.

14. The apparatus of claim 9, wherein the plurality of receptacles are proximally arranged in a circular manner on the outer surface.

15. An apparatus used for calibrating an endpoint control device by a meter calibration device, wherein the endpoint control device is configured to monitor power usage by a corresponding endpoint device, the apparatus comprising:

a first adapter including a plurality of receptacles on an outer surface of the first adapter, the plurality of receptacles configured to connect to the endpoint control device;

a second adapter including a plurality of terminals disposed on an outer surface of the second adapter and a plurality of connectors disposed on an inner surface of the second adapter, wherein the plurality of terminals project away from the outer surface of the second adapter and are configured to connect to the meter calibration device and are electrically connected to the plurality of connectors disposed on the inner surface of the second adapter;

a housing fixedly securing the first adapter and the second adapter, wherein the first adapter is mounted to a first outer surface of the housing and the second adapter is mounted to a second outer surface of the housing and the first outer surface and the second outer surface are approximately perpendicular; and a plurality of electrical connectors within the housing, wherein each of the electrical connectors connects a connector located on an inner surface of the first adapter and associated with one of the plurality of receptacles of the first adapter with at least one of the plurality of connectors of the second adapter disposed on the inner surface of the second adapter.

16. The apparatus of claim 15, wherein the plurality of connectors of the first adapter includes three connectors, and the plurality of connectors disposed on the inner surface of the second adapter includes four connectors, and the plurality of electrical connectors includes three electrical connecters, and wherein a first electrical connector connects a first one of the plurality of connectors of the first adapter to a first one of the plurality of connectors disposed on the inner surface of the second adapter, a second electrical connector connects a second one of the plurality of connectors of the first adapter to a second one of the plurality of connectors disposed on the inner surface of the second adapter, and a third electrical connector connects a third one of the plurality of connectors of the first adapter to third and fourth ones of the plurality of connectors disposed on the inner surface of the second adapter.

17. The apparatus of claim 15, wherein the housing has a cylindrical shape with a recessed portion and a non-recessed portion, and wherein the plurality of electrical connectors connect to the first adapter within the non-recessed portion of the housing.

18. The apparatus of claim 15, wherein the housing has a cylindrical shape with a recessed portion, the recessed portion defined by the first outer surface of the housing and a second outer surface of the housing, wherein the outer surface of the second adapter is approximately parallel to the second outer surface of the housing, and wherein the first adapter is mounted to the first outer surface of the housing.

19. The apparatus of claim 15, wherein the housing has a cylindrical shape and the second adapter is located at a base of the housing.

20. The apparatus of claim 15, wherein the plurality of receptacles are proximally arranged in a circular manner on the outer surface.

* * * * *